United States Patent [19]

Movchan et al.

[11] 4,105,890

[45] Aug. 8, 1978

[54] DEVICE FOR ELECTRON-BEAM HEATING OF MATERIALS

[76] Inventors: Boris Alexeevich Movchan, ulitsa Darvina, 7, kv. 7; Viktor Alexandrovich Timashov, Vozdukhoflotsky prospekt, 5, kv. 10; Konstantin Nikolaevich Kljuev, ulitsa Shota Rustaveli, 30, kv. 13, all of Kiev, U.S.S.R.

[21] Appl. No.: 792,981

[22] Filed: May 2, 1977

[30] Foreign Application Priority Data

May 3, 1976 [SU] U.S.S.R. .............. 2355080

[51] Int. Cl.² .............................. B23K 9/00
[52] U.S. Cl. .................. 219/121 EB; 313/431; 330/4.7
[58] Field of Search ............. 313/431; 330/4.7, 4.5; 219/121 EB, 121 EM

[56] References Cited

U.S. PATENT DOCUMENTS

| 3,373,310 | 3/1968 | Worcester | 330/4.7 |
| 3,555,347 | 1/1971 | Dickinson | 219/121 EB |
| 3,900,736 | 8/1975 | Michail et al. | 219/121 EB |

*Primary Examiner*—Bruce A. Reynolds
*Assistant Examiner*—Fred E. Bell
*Attorney, Agent, or Firm*—Lackenbach, Lilling & Siegelg

[57] ABSTRACT

A device for electron-beam heating of materials comprises an electron gun and an electromagnetic electron beam control system with a rectangular magnetic circuit. The opposite rods of the magnetic circuit accommodate beam deflection windings as well as beam correction and spreading windings. An additional winding is also provided on each magnetic circuit rod. The magnetic fields created by the current flowing through said additional windings form a magnetic quadrupole lens. The device permits manipulating the electron beam so as to obtain a sufficiently long and narrow focal spot on the surface being heated, and also the beam deflection angles range from 0° to 45°.

2 Claims, 3 Drawing Figures

U.S. Patent  Aug. 8, 1978  4,105,890
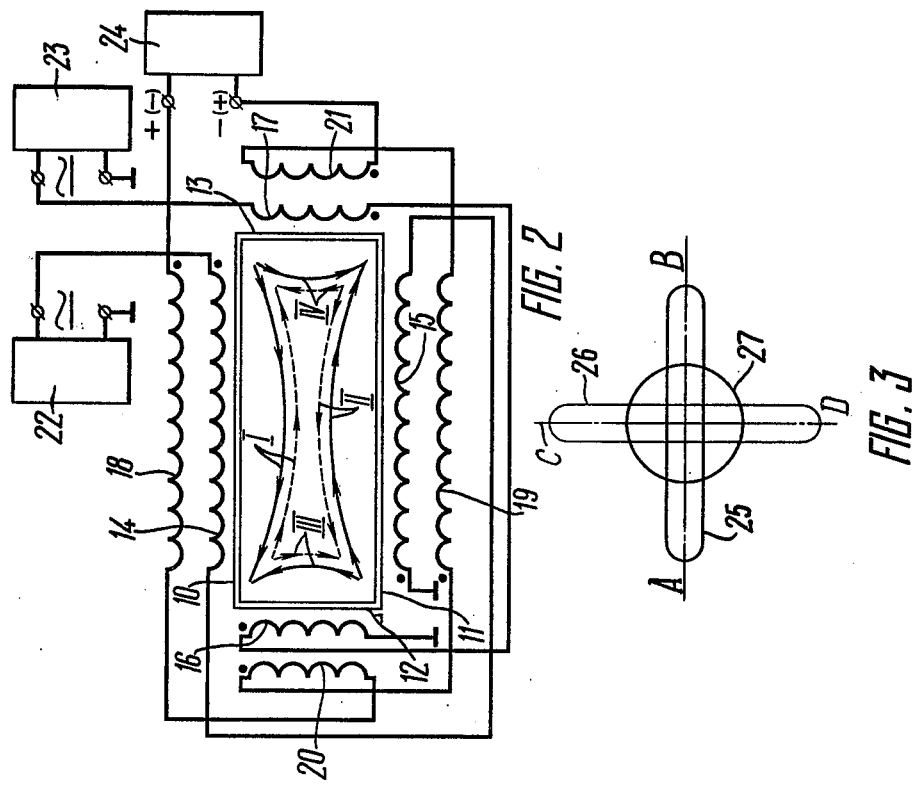
FIG. 2
FIG. 3
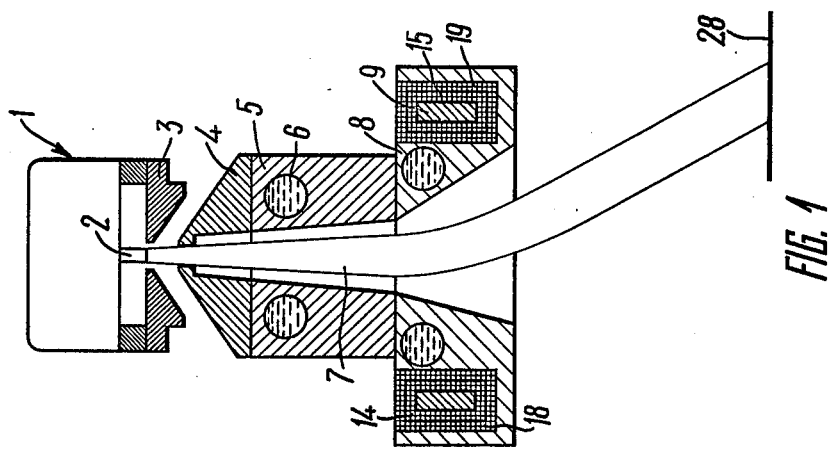
FIG. 1

DEVICE FOR ELECTRON-BEAM HEATING OF MATERIALS

The present invention relates to devices for heating materials in vacuum, and more particularly to a device for electron-beam heating of materials.

The invention can most advantageously be used for heating, melting and evaporating various materials in vacuum.

A prior art device for electron-beam heating of materials in vacuum comprises an electron gun producing a flat, slightly divergent beam and including a linear thermoionic cathode, a cathode-adjacent focusing electrode, and an accelerating anode. The accelerating anode is structurally associated with a beam guide mounted on a base having grooves which accommodate an electromagnetic electron beam control system. The control system is essentially a closed rectangular magnetic circuit having longer rods accommodating beam deflection coils, and shorter rods carrying beam correction and spreading coils. Every two deflection coils and correction spreading coils are interconnected in series with their respective terminals. The point of connection of the deflection coils has a tap for separate shunting thereof with adjustable resistors.

The electromagnetic beam control system permits the flat electron beam produced by the electron gun to be deflected through 45° with simultaneous focusing thereof and transformation into a cylindrical one. The system also permits correction of the beam's path and spreading of the beam in a plane normal to the deflection plane.

Transformation of the deflected beam into a cylindrical one or changing the shape of the focal spot obtained on the surface being heated is achieved by varying the ampere-turn ratio in the deflection coils by means of the shunting adjustable resistors, whereby a nonuniform magnetic field of a required configuration is created.

In this device, the efficiency of focusing the beam and changing the shape of the focal spot depends on the preset beam deflection angle. For example, when the device operates with relatively small deflection angles (15° and less), which is required for a number of production processes, the beam focusing efficiency is minimized and the possibility of changing the shape of the beam is limited. This is due to the low intensity of the deflection coil magnetic fields.

It is, therefore, an object of the present invention to provide a device for electron-beam heating of materials with a higher electron beam focusing efficiency and to provide a device with the ability to change the shape of the electron beam within a wide range, at preset deflection angles (from 0 ® to 45°).

These and other objects of the invention are attained by a device for electron-beam heating of materials, comprising an electron gun for producing an electron beam and an electromagnetic beam control system including a rectangular magnetic circuit with at least two beam deflection windings arranged on two opposite magnetic circuit rods and at least two beam correction and spreading windings arranged on the other two opposite magnetic circuit rods, on the magnetic circuit. Each rod of the magnetic circuit also accommodates an additional winding, the magnetic fields created by the current flowing through these additional windings forming a magnetic quadrupole lens.

Preferably, the device should be provided with a power supply permitting stepless regulation of its voltage and reversal of polarity, with the additional windings being connected in series and coupled to said power supply.

The device of the present invention permits varying the electron beam to obtain a sufficiently long and narrow focal point on a surface being heated, at small deflection angles. This feature of the invention is of advantage not only in vacuum-melting and -evaporation systems, but also in systems for heating moving ribbon-shaped materials without scanning the electron beam.

The invention will now be described in greater detail with reference to a preferred embodiment thereof, taken in conjunction with the accompanying drawings, wherein:

FIG. 1 is a cross-sectional view of a device for electron-beam heating of materials;

FIG. 2 is an electric circuit diagram of an electromagnetic control system showing the shape of the magnetic field created by the additional windings; and FIG. 3 shows the shape of a focal spot obtained on the surface of a material being heated.

Referring to FIG. 1, the device for electron-beam heating comprises an electron gun producing a flat, slightly divergent electron beam and including a cathode assembly 1 with a linear thermionic cathode 2 and a cathode-adjacent focusing electrode 3, as well as an accelerating anode 4. The device also comprises a beam guide 5 made from a copper block with water-cooling ducts 6 and a rectangular aperture for the passage of a flat beam 7. The accelerating anode 4 is structurally associated, through the beam guide 5, with a base 8 with grooves accommodating an electromagnetic control system made in the form of a closed rectangular magnetic circuit 9. Its opposite rods 10 (FIG. 2), 11 and 12, 13 accommodate, respectively, beam deflection windings 14, 15 and beam correction and spreading windings 16, 17. Each rod 10, 11, 12, 13 also carries an additional winding 18, 19, 20 and 21, respectively.

The deflection windings 14 and 15 are connected in series to a power supply 22. The beam correction and spreading windings are also connected in series and coupled to a power supply 23. The additional windings 16 and 17 18, 19, 20 and 21 are connected in series to a power supply 24 featuring stepless regulation of its voltage and polarity reversal.

The additional windings 18, 19, 20 and 21 create magnetic fields I, II, III and IV, respectively, across the path of the beam 7, said fields forming a magnetic quadrupole lens. Solid lines show the magnetic fields I, II, III and IV corresponding to one polarity of the voltage of the power supply 24, while broken lines indicate the same fileds at the opposite polarity.

FIG. 3 illustrates focal spots 25, 26 and 27 obtained on a surface 28 (FIG. 1) of a material being heated, the axes of symmetry of these focal spots being designated AB (FIG. 3) and CD, respectively.

The herein-disclosed device for electron-beam heating of materials operates as follows:

The electrons emitted by the linear thermionic cathode 2 (FIG. 1) are made, by the cathode-adjacent focusing electrode 3 and accelerating anode 4, to form a flat, slightly divergent beam 7 passing through the beam guide 5. After transformation and deflection by the electromagnetic control system, the beam acquires a required shape and is incident upon the surface 28 of the material being heated at a predetermined angle.

At a particular polarity of the voltage from the power supply 24 (FIG. 2), the current through the additional windings 18 and 19 creates the transverse magnetic fields I and II (shown in FIG. 2 by solid lines) which exert a collecting action on the flat slightly divergent beam 7 (FIG. 1), while the current through the additional windings 20 and 21 (FIG. 2) creates the transverse fields III and IV (shown in FIG. 2 by solid lines) which in turn exert a spreading action on the same beam 7 (FIG. 1). As a result of the combined action of the magnetic fields I, II, III and IV on the electron beam 7 (FIG. 1), a focal spot 25 (FIG. 3) is formed on the surface 28 of the material being heated, which is elongate along the axis AB and pinched along the axis CD.

When the polarity of the voltage from the power supply 23 (FIG. 2) is reversed, the magnetic fields I and II (shown in FIG. 2 by broken lines) of the windings 18 and 19 spread the electron beam 7 (FIG. 1), while the magnetic fields III and IV of the windings 20 and 21 pinch the beam 7 with the result that a focal spot 26 (FIG. 3) is obtained on the surface 28 of the material being heated, which is elongate along the axis CD and pinched along the axis AB.

As can be inferred from the above, stepless control of the voltage from the power supply 24 (FIG. 2) and reversal of its polarity permits not only stretching the focal spot 25 (FIG. 3) or 26 along the axis AB or CD, respectively, but also focusing the electron beam 7 (FIG. 1) into a round spot 27 (FIG. 3).

It can also be seen from the foregoing that the effect of the magnetic quadrupole lens on the electron beam 7 (FIG. 1) involves a sufficiently wide range of angles, from 0° to 45°, in both directions with respect to the transverse plane of symmetry of the device.

Also, the device of the invention eliminates the necessity for shunting resistors which, in the prior art device, were intended for focusing adjustment of the electron beam and changing the shape of the focal spot.

What is claimed is:

1. A device for electron-beam heating of materials comprising:
    an electron gun for producing an electron beam;
    an electromagnetic system for controlling said electron beam having
    a closed rectangular magnetic circuit provided with four rods;
    at least two beam deflection windings arranged on opposite rods of said magnetic circuit and intended to deflect said electron beam in a plane normal to the plane of said beam;
    at least two beam correction and spreading windings arranged on the other two opposite rods of said magnetic circuit and intended to deflect said electron beam on the surface of a material being heated; and
    at least four windings, each being arranged on a respective rod of said magnetic circuit, the magnetic fields created by the current flowing through said windings forming a magnetic quadrupole lens.

2. A device as claimed in claim 1, wherein:
    said four windings whose magnetic fields form said magnetic quadrupole lens are connected in series; and to
    a power supply with stepless regulation of its voltage and reversal of its polarity.

* * * * *